(12) United States Patent
Kwon

(10) Patent No.: US 6,574,771 B1
(45) Date of Patent: Jun. 3, 2003

(54) GALIOS FIELD PROCESSOR HAVING DUAL PARALLEL DATA PATH FOR BOSE CHAUDHURI HOCQUENGHEM/REED-SOLOMON DECODER

(75) Inventor: Hyung-joon Kwon, Yongin (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/528,676

(22) Filed: Mar. 20, 2000

(30) Foreign Application Priority Data

Mar. 24, 1999 (KR) .......................................... 99-10078

(51) Int. Cl.⁷ ............................................ H03M 13/00
(52) U.S. Cl. ........................ 714/782; 714/784; 714/785
(58) Field of Search ................................ 714/782, 784, 714/785, 781

(56) References Cited

U.S. PATENT DOCUMENTS 5,535,225 A * 7/1996 Mayhew et al.
6,317,858 B1 * 11/2001 Cameron
6,378,104 B1 * 4/2002 Okita

OTHER PUBLICATIONS

H.C. Chung, C. Shung, "A Reed–Solomon Decorder for DVD Application," IEEE International Solid–State Circuits Conference, pp. 957–960.
Gonsalez, R., Horowitz, M., "Energy Dissipation in General Purpose Processors," IEEE Journal of Solid–State Circuits, vol. 31, No. 9, pp. 12–13.
Blahut, R.E., "Theory and Practice of Error Control Codes," Addison–Wesley, 1984, pp. 196–208.

\* cited by examiner

*Primary Examiner*—Phung M. Chung
(74) *Attorney, Agent, or Firm*—Mills & Onello LLP

(57) ABSTRACT

A Galois field processor having a dual parallel data path for a Bose Chaudhuri Hocquenghem/Reed-Solomon (BCH/RS) decoder is provided. The Galois field processor includes a syndrome register block for storing syndrome values transmitted by a syndrome generating block, a correction polynomial register block, a connection polynomial register block, and a discrepancy register block. A dual mode Galois field data path (DMGFDP) includes a first data path for receiving the respective outputs of the syndrome register block, the correction polynomial register block, the connection polynomial register block, and the discrepancy register block, performing predetermined operations related to the even-degree coefficients of correction and connection polynomial, and outputting the even-degree coefficient output. A second data path performs predetermined operations related to the odd-degree coefficients of the correction and connection polynomial and outputs the odd-degree coefficient output. A delta output unit performs predetermined operations related to the even-degree and the odd-degree coefficients of the connections polynomial and outputs the delta output. An output unit outputs the coefficients of an error location polynomial, according to a control signal. Since the Galois processor, in which latency during the operation processes is minimized, has a small area and operates at high speed, the performance of the decoder is greatly improved.

9 Claims, 7 Drawing Sheets

TIME IN BASE CYCLES

GALIOS FIELD PROCESSOR HAVING DUAL PARALLEL DATA PATH FOR BOSE CHAUDHURI HOCQUENGHEM/REED-SOLOMON DECODER

BACKGROUND OF THE INVENTION

1. Field of the Invention

The present invention relates to an error correcting apparatus, and more particularly, to a Galois field processor having a dual parallel data path for a Bose Chaudhuri Hocquenghem/Reed-Solomon (BCH/RS) decoder capable of improving the performance of a decoder using a dual data path in the BCH/RS decoder.

2. Description of the Related Art

With the development of digital technology, techniques for recovering from errors generated in channels or media have been developed. Various error correction techniques have been reported and developed. Among the techniques, a Bose Chaudhuri Hocquenghem/Reed-Solomon (BCH/RS) code, which is a type of linear block code, is most widely used due to its excellent error correction capability and efficient encoding and decoding procedures. The decoding procedure of the BCH/RS code is more complicated than its encoding procedure. As the number of systems which require high speed digital data processing increases, decoding hardware increasingly requires architecture in which high speed digital processing can be performed.

However, previously known decoding hardware architectures do not readily process data at speeds as high as required. The main functions of a BCH/RS decoder includes 1) calculating from a transmitted code a syndrome having information on the presence of errors, 2) calculating the coefficients of an error location polynomial from the calculated syndrome, 3) calculating the roots of the error location polynomial, 4) searching for an error value, and 5) recovering the error using the error location polynomial roots and the error value.

In this approach, calculating the roots of the error location polynomial requires the most complicated process and hardware. Therefore, this is typically regarded as the most important step in determining the high speed operation and the error correction ability of the BCH/RS decoder. Various approaches to performing this step have been reported. The Euclidian algorithm and the feedback shift register (FSR) synthesis algorithm suggested by Massey-Berlekamp are commonly used in no less than three symbols of multiple error correction. However, since a plurality of multipliers and long latency are required when the Euclidian algorithm is realized as hardware, the Massey-Berlekamp algorithm is commonly used when a high speed correction is required.

The number of multipliers and inverse circuits and the latency during execution processes also vary in the Massey-Berlekamp algorithm according to how the algorithm is realized. This significantly affects the size and the performance of the hardware.

SUMMARY OF THE INVENTION

To solve the above problem, it is an object of the present invention to provide a Galois field processor having a dual parallel data path for a Bose Chaudhuri Hocquenghem/Reed-Solomon (BCH/RS) decoder, which has a small area and operates at a high speed and where the latency during execution processes can be minimized.

Accordingly, to achieve the above object, there is provided a Galois field processor having a dual parallel data path for a Bose Chaudhuri Hocquenghem/Reed-Solomon (BCH/RS) decoder. The processor of the invention includes a syndrome register block having an even-degree syndrome register block for storing even-degree syndrome values from among the syndrome values transmitted by a syndrome generating block and an odd-degree syndrome register block for storing odd-degree syndrome values from among the syndrome values transmitted by the syndrome generating block. A correction polynomial register block includes an even-degree correction polynomial coefficient register block for receiving an even-degree coefficient output and storing even-degree coefficients of a correction polynomial, and an odd-degree correction polynomial coefficient register block for receiving an odd-degree coefficient output and storing odd-degree coefficients of the correction polynomial. A connection polynomial register block includes: (i) an even-degree modified connection polynomial coefficient register block for receiving the even-degree coefficient output and storing the even-degree coefficients of a modified connection polynomial, (ii) an odd-degree modified connection polynomial coefficient register block for receiving the odd-degree coefficient output and storing the odd-degree coefficients of the modified connection polynomial, (iii) an even-degree connection polynomial coefficient register block for receiving the even-degree coefficient output and the output of the even-degree modified connection polynomial coefficient register block and outputting the even-degree coefficients of a connection polynomial, and (iv) an odd-degree connection polynomial coefficient register block for receiving the odd-degree coefficient output and the output of the odd-degree modified connection polynomial coefficient register block and outputting the odd-degree coefficients of the connection polynomial. A discrepancy register block receives delta output and storing a discrepancy value for updating the connection polynomial so as to continuously generate syndromes equal to previously known syndromes. A dual mode Galois field data path (DMGFDP) includes a first data path for (i) receiving the respective outputs of the syndrome register block, the correction polynomial register block, the connection polynomial register block and the discrepancy register block, (ii) performing first predetermined operations related to the even-degree coefficients of the correction and connection polynomials, and (iii) outputting the even-degree coefficient result of the first predetermined operations. The DMGFDP also includes a second data path for (i) performing second predetermined operations related to the odd-degree coefficients of the correction and connection polynomials and (ii) outputting the odd-degree coefficient result of the second predetermined operations. The DMGFDP also includes a delta output unit for performing third predetermined operations related to the even-degree and odd-degree coefficients of the connection polynomial and outputting the delta output result of the third predetermined operations. An output unit synthesizes the output of the even-degree connection polynomial coefficient register block with the output of the odd-degree connection polynomial coefficient register block and outputs the synthesis results as the coefficients of an error location polynomial, according to a control signal.

In one embodiment, the first data path includes a first register fetch unit which includes: (i) a first input register for selecting, storing and outputting one of the output of the discrepancy register block, the output of the even-degree connection polynomial coefficient register block, and the data of a first bypass bus, (ii) a second input register for selecting, storing and outputting one of the output of the discrepancy register block and the output of the even-degree syndrome register block, and (iii) a third input register for selecting, storing and outputting one of the output of the even-degree correction polynomial coefficient register, the output of the even-degree connection polynomial coefficient register block, and the output of the odd-degree connection polynomial coefficient register block. A first execute unit includes a first multiplier for multiplying the output of the second input register with the output of the third input register and a first adder for adding the output of the first input register to the output of the first multiplier. A first output register selects and stores one of the output of the first multiplier and the output of the first adder and outputs the selected one of the output of the first multiplier and the output of the first adder as the even-degree coefficient output, and provides input data to the first input register through the first bypass bus.

In one embodiment, the second data path includes a second register fetch unit which includes (i) a fourth input register for receiving, storing, and outputting the output of the odd-degree connection polynomial coefficient register block, (ii) a fifth input register for selecting, storing and outputting one of the output of the odd-degree correction polynomial coefficient register block, the output of the even-degree connection polynomial coefficient register block, and the output of the odd-degree connection polynomial coefficient register block, and (iii) a sixth input register for selecting, storing and outputting one of the output of the discrepancy register block, the output of the odd-degree syndrome register block, and the data of a second bypass bus. A second execute unit includes a second multiplier for multiplying the output of the fifth input register with the output of the sixth input register and a second adder for adding the output of the fourth input register to the output of the second multiplier. A second output register selects and stores one of the output of the second multiplier and the output of the second adder and outputs the selected one of the output of the second multiplier and the output of the second adder as the odd-degree coefficient output. The second output register provides input data to the sixth input register through the second bypass bus.

In one embodiment, the delta output unit includes a third adder for adding the output of the first adder to the output of the second adder and a third output register for storing and outputting the output of the third adder.

In one embodiment, the even-degree correction polynomial coefficient register block and the odd-degree correction polynomial coefficient register block each comprise a plurality of registers. The output of a lower-degree register is input to the right upper-degree register.

The discrepancy register block can include an accumulator for obtaining the discrepancy value for updating the connection polynomial so as to continuously generate syndromes equal to previously known syndromes. The discrepancy register block can also include a delta register block having a first multiplexer for selectively outputting the delta output and the output of the accumulator and a register for storing the output of the first multiplexer and outputting the output of the first multiplexer to the accumulator. The discrepancy register block can also include an inversion unit for inverting the output of the accumulator and a second multiplexer for selectively outputting the output of the delta register block and the output of the inversion unit.

A Galios field processing apparatus for use in a Bose Chaudhuri Hocquenghem/Reed-Solomon (BCH/RS) decoder performs a feedback shift register (FSR) synthesis algorithm of Massey-Berlekamp. The apparatus includes a first processor for receiving even-degree syndrome values transmitted by a syndrome generating block, odd-degree coefficients of a connection polynomial and a discrepancy value, performing first predetermined operations related to even terms of a delta and even-degree coefficients of both of a correction polynomial and the connection polynomial, and outputting even-degree coefficients of the connection polynomial and a summation of the even terms of the delta, a second processor for receiving odd-degree syndrome values transmitted by the syndrome generating block, even-degree coefficients of the connection polynomial and the discrepancy value, performing second predetermined operations related to odd terms of the delta and odd-degree coefficients of the polynomials, and outputting odd-degree coefficients of the connection polynomial and a summation of the odd terms of the delta, a delta output unit for receiving and adding the summation of the even terms of the delta and the summation of the odd terms of the delta and outputting an addition result as a delta output, a discrepancy register block for receiving the delta output and storing the discrepancy values for updating the connection polynomial so as to continuously generate syndromes equal to previously known syndromes, and an output unit for synthesizing the even-degree coefficients of the connection polynomial and the odd-degree coefficients of the connection polynomial and outputting the synthesis results as the coefficients of an error location polynomial, according to a control signal.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DESCRIPTION OF PREFERRED
EMBODIMENTS OF THE INVENTION

Hereinafter, a Galois field processor having a dual parallel data path for a Bose Chaudhuri Hocquenghem/Reed-Solomon (BCH/RS) decoder according to an embodiment of the present invention will be described in detail with reference to the attached drawings.

The feedback shift register (FSR) synthesis algorithm suggested by Massey-Berlekamp is a set of processes for generating a feedback shift register (FSR) having a minimum length so as to generate previously known syndrome values. However, in the present invention, the coefficients of an error location polynomial are obtained not by generating the FSR as in the Massey-Berlekamp algorithm, but by extracting operations required for executing the Massey-Berlekamp algorithm and realizing the present invention using a dual mode Galois field data path having two data paths of a register-register level.

Main operations required for extracting commands for executing the Massey-Berlekamp algorithm are shown in Table 1.

TABLE 1

| Required operations | Descriptions |
| --- | --- |
| $C(x) = 1, D(x) = x, L = 0, n = 1$ | INITIALIZE |
| $\delta = S_n + \sum_{i=1}^{L} C(x)S_{(n-i)}$ | MULT/ADDACC/ADD |
| $C^*(x) = C(x) - \delta D(x)$ | MULT/ADD |
| $D(x) = C(x)/\delta$ | INV/MULT |
| $C(x) = C^*(x)$ | COPY |
| $D(x) = xD(x)$ | SHL with input symbol 0 |
| +Conditional branch | JUMP |

The Massey-Berlekamp algorithm is a set of processes for generating a FSR having a minimum length so as to generate the previously known syndrome values as mentioned above. Main polynomials required for the Massey-Berlekamp algorithm are 1) a connection polynomial (C(x)), 2) a correction polynomial (D(x)), and 3) a discrepancy value. In the Massey-Berlekamp algorithm, the discrepancy value is the difference between the generated syndrome value and the previously known syndrome value. The coefficients of the connection polynomial C(x) become almost equal to the coefficients of the error location polynomial by repeating processes of updating the correction polynomial D(x) using the difference and correcting the value of the connection polynomial C(x) using the value of a new correction polynomial D(x), thus continuously generating syndromes almost equal to the previously known syndromes.

As shown in Table 1, various operations such as addition, multiplication, inversion, accumulation, and shift are used in the Massey-Berlekamp algorithm.

Figure 1:
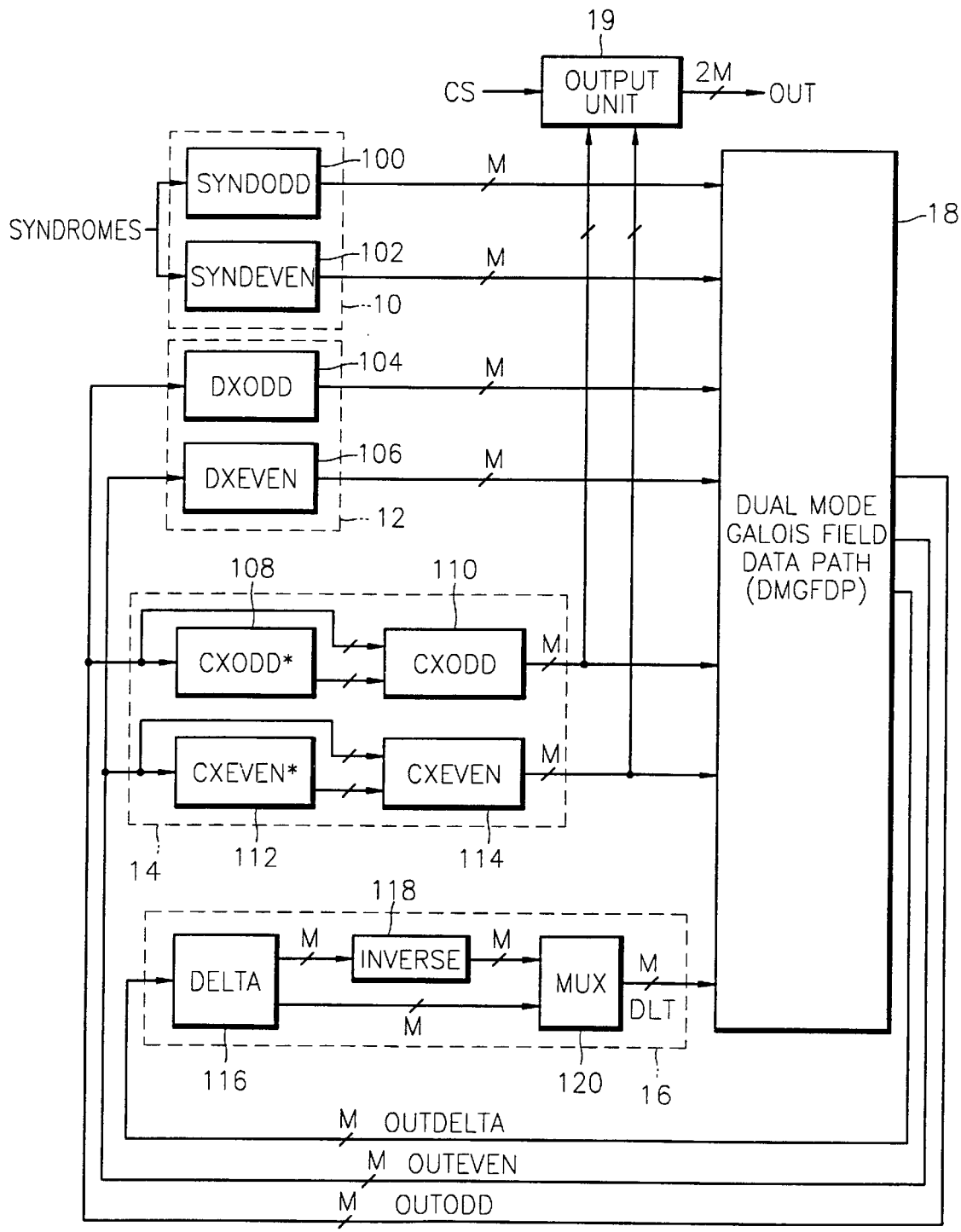
FIG. 1 is a schematic block diagram of a Galois field processor having a dual parallel data path for a Bose Chaudhuri Hocquenghem/Reed-Solomon (BCH/RS) decoder according to an embodiment of the present invention.

FIG. 1 is a block diagram of the Galois field processor having the dual parallel data path for the BCH/RS decoder according to one embodiment of the present invention. This Galois field processor includes a syndrome register block 10, a correction polynomial register block 12, a connection polynomial register block 14, a discrepancy register block 16, a dual mode Galois field data path (DMGFDP) 18, and an output unit 19.

The syndrome register block 10 includes an even-degree syndrome register block 102 for storing even-degree syndrome values among the syndromes transmitted by a syndrome generating block (not shown) and an odd-degree syndrome register block 100 for storing odd-degree syndrome values among the syndromes transmitted by the syndrome generating block. The correction polynomial register block 12 includes an even-degree correction polynomial coefficient register block 106 for receiving and storing an even-degree coefficient output (OUTEVEN) and an odd-degree correction polynomial coefficient register block 104 for receiving and storing an odd-degree coefficient output (OUTODD).

The connection polynomial register block 14 includes an even-degree connection polynomial coefficient register block 112, an odd-degree connection polynomial coefficient register block 108, an even-degree connection polynomial coefficient register block 114, and an odd-degree connection polynomial coefficient register block 110. The even-degree modified connection polynomial coefficient register block 112 receives the even-degree coefficient output (OUTEVEN) and stores the even-degree coefficients of a modified connection polynomial. The odd-degree modified connection polynomial coefficient register block 108 receives an odd-degree coefficient output (OUTODD) and stores the odd-degree coefficients of the modified connection polynomial. The even-degree connection polynomial coefficient register block 114 receives the even-degree coefficient output (OUTEVEN) and the output of the even-degree modified connection polynomial coefficient register block 112 and outputs the even-degree coefficients of the connection polynomial. The odd-degree connection polynomial coefficient register block 110 receives the odd-degree coefficient output (OUTODD) and the output of the odd-degree modified connection polynomial coefficient register block 108 and.outputs the odd-degree coefficients of the connection polynomial.

The discrepancy register block 16, which receives a delta output (OUTDELTA) and stores a discrepancy value for updating the connection polynomial so as to continuously generate syndromes equal to the previously known syndromes, includes a delta register block 116, an inversion unit 118, and a multiplexer 120. The delta output OUTDELTA represents the second term of the function δ shown in Table 1.

The register blocks 108, 110, 112, and 114, referred to as CX in FIG. 1, are register blocks for storing the coefficients of the modified connection polynomial or the connection polynomial. The register blocks 104 and 106 referred to as DX are register blocks for storing the coefficients of the correction polynomial. Also, the register blocks 100 and 102 referred to as SYND are register blocks for storing the syndrome values transmitted by the syndrome generating block (not shown). The register block 116 referred to as DELTA is a register block for storing the discrepancy value for updating the connection polynomial so as to continuously generate syndromes equal to the previously known syndromes.

Figure 2:
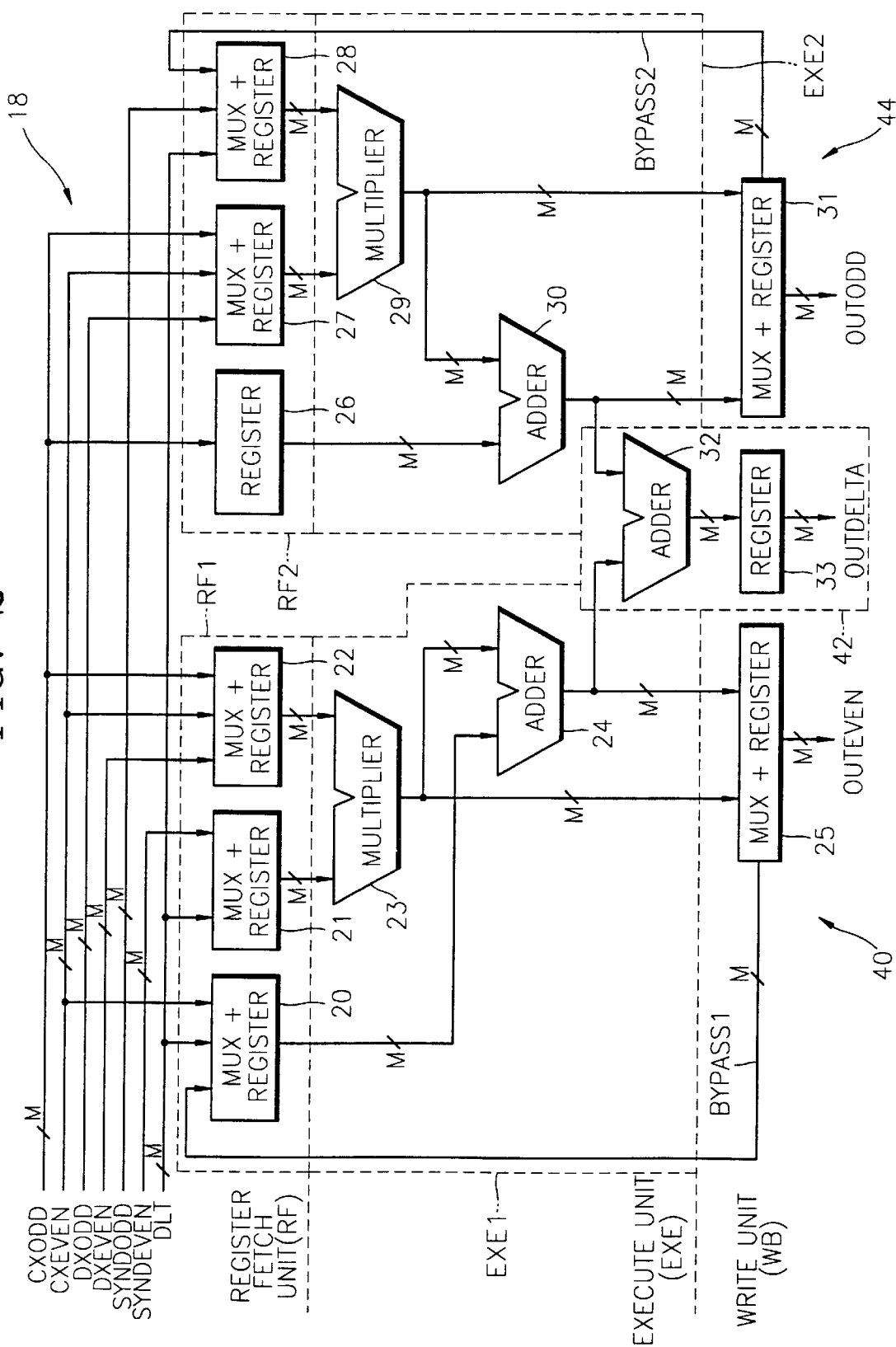
FIG. 2 is a schematic block diagram which illustrates the architecture of the dual mode Galois field data path shown in FIG. 1.

Referring to FIGS. 1 and 2, the DMGFDP 18 includes first and second data paths 40 and 44 and a delta output unit 42. The first and second data paths 40 and 44 receive the outputs of the syndrome register block 10, the correction polynomial register block 12, the connection polynomial register block 14, and the discrepancy register block 16. The first data path 40 performs predetermined operations related to the even-degree coefficients of the correction and connection polynomials and outputs the even-degree coefficient output (OUTEVEN) which is the operation result. The second data path 44 performs predetermined operations related to the odd-degree coefficients of the correction and connection polynomials and outputs the odd-degree coefficient output OUTODD which is the operation result. The delta output unit 42 performs an operation related to the even-degree and odd-degree coefficients of the connection polynomial and outputs the delta output (OUTDELTA) which is the operation result. The output unit 19 synthesizes the output of the even-degree modified connection polynomial coefficient register block 114 with the output of the odd-degree modified connection polynomial coefficient register block 110 and outputs the synthesis result as the coefficients (OUT) of the error location polynomial, according to a control signal CS.

FIG. 2 shows the architecture of the DMGFDP 18 shown in FIG. 1 in detail. The DMGFDP 18 of FIG. 2 includes the first data path 40, the second data path 44, and the delta output unit 42.

The first data path 40 includes a first register fetch unit RF1, a first execute unit EXE1, and a first output register block 25 which constitutes a write unit WB. The first register fetch unit RF1 includes first, second, and third input registers 20, 21, and 22. The first input register 20 selects one of the output DLT of the discrepancy register block 16, the output CXEVEN of the even-degree connection polynomial coefficient register block 114, and the data of a first bypass bus BYPASS1 and stores and outputs the selected one. The second input register 21 selects either the output DLT of the discrepancy register block 16 or the output SYNDEVEN of the even-degree syndrome register block 102 and stores and outputs the selected one. The third input register 22 selects one of the output DXEVEN of the even-degree correction polynomial coefficient register block 106, the output CXEVEN of the even-degree connection polynomial coefficient register block 114, and the output CXODD of the odd-degree connection polynomial coefficient register block 110 and stores and outputs the selected one.

The first execute unit EXE1 includes a first multiplier 23 for multiplying the output of the second input register 21 with the output of the third input register 22, a first adder 24 for adding the output of the first input register 20 to the output of the first multiplier 23. The first output register 25 selects either the output of the first multiplier 23 or the output of the first adder 24, stores the selected one, outputs the selected one as the even-degree coefficient output (OUTEVEN), and provides input data to the first input register 20 through the first bypass bus BYPASS1. The first execute unit EXE1 supplies even terms of a delta to the delta output unit 42, and supplies even-degree coefficients of both of the correction polynomial and the modified connection polynomial. Here, the even terms of the delta are $C_2(x)S_{n-2}$, $C_4(x)S_{n-4}$, ....

The second data path 44 includes a second register fetch unit RF2, a second execute unit EXE2, and a second output register 31 which constitutes the write unit WB. The second register fetch unit RF2 includes fourth, fifth, and sixth input registers 26, 27, and 28. The fourth input register 26 receives, stores, and outputs the output CXODD of the odd-degree connection polynomial coefficient register block 110. The fifth input register 27 selects one of the output DXODD of the odd-degree correction polynomial coefficient register block 104, the output CXEVEN of the even-degree connection polynomial coefficient register block 114, and the output CXODD of the odd-degree connection polynomial coefficient register block 110 and stores and outputs the selected one. The sixth input register 28 selects one of the output DLT of the discrepancy register block 16, the output SYNDODD of the odd-degree syndrome register block 100, and the data of a second bypass bus BYPASS2 and stores and outputs the selected one.

The second execute unit EXE2 includes a second multiplier 29 for multiplying the output of the fifth input register 27 with the output of the sixth input register 28 and a second adder 30 for adding the output of the fourth input register 26 to the output of the second multiplier 29. The second output register 31 selects either the output of the second multiplier 29 or the output of the second adder 30, stores the selected one, outputs the selected one as the odd-degree coefficient output OUTODD, and provides input data to the sixth input register 28 through the second bypass bus BYPASS2. The second execute unit EXE2 supplies odd terms of the delta to the delta output unit 42, and supplies odd-degree coefficients of both of the correction polynomial and the modified connection polynomial. Here, the odd terms of the delta are $C_1(x)S_{n-1}$, $C_3(X)S_{n-3}$, ....

Also, the delta output unit 42 includes a third adder 32 for adding the output of the first adder 24 to the output of the second adder 30 and a third output register 33 for storing and outputting the output of the third adder 32. The third adder 32 adds even terms of a delta and odd terms of the delta to output the delta.

Referring to FIGS. 1 and 2, the Galois field processor having a dual parallel data path for the BCH/RS decoder according to the embodiment of the present invention is three-stage pipelined in order to achieve high speed operation through the entire system. Namely, the Galois field processor having the dual parallel data path for the BCH/RS decoder includes a fetching unit for fetching sources from registers, an execute unit EXE for actually performing calculation, and a write unit WB for writing the generation result in the registers.

The DMGFDP 18 of FIG. 2 is a dual-type pipelined data path specially tuned to the Massey-Berlekamp algorithm so as to effectively perform the Massey-Berlekamp algorithm.

The dual mode Galois field data path shown in FIG. 2 has an architecture where two parallel data paths, that is, the first data path 40 and the second data path 44, respectively perform operations related to the even-degree coefficients and operations related to the odd-degree coefficients, multiplex the operation results, and write the operation results in the register blocks. The two data paths are dual data paths, in which the fact that there is little interaction between the even-degree coefficients and the odd-degree coefficients of the polynomials when the Massey-Berlekamp algorithm is executed is utilized. The delta output unit 42 performs operations related to both the even-degree coefficients and the odd-degree coefficients among the operations required for executing the Massey-Berlekamp algorithm.

Meanwhile, in the case of an architecture where a data path having two or more operation units is included, the throughput of the two or more operation units is not doubled since a source and a resource such as a destination register are simultaneously input. Therefore, in the present invention, the first data path 40 operates as an even-degree coefficient processor and the second data path 44 operates as an odd-degree coefficient processor in order to prevent the source of the data path and the destination of the data path from being simultaneously input. Accordingly, the entire throughput is almost doubled with respect to a data path in the form of a single unit.

Also, the results of the execute units EXE1 and EXE2 can be used for a next operation without a write operation into register files by making the first bypass bus BYPASS1 and the second bypass BYPASS2 shown in FIG. 2 direct connection paths from the execute units EXE1 and EXE2 to the register fetch units RF1 and RF2. Accordingly, the entire command/cycle is improved.

Figure 3:
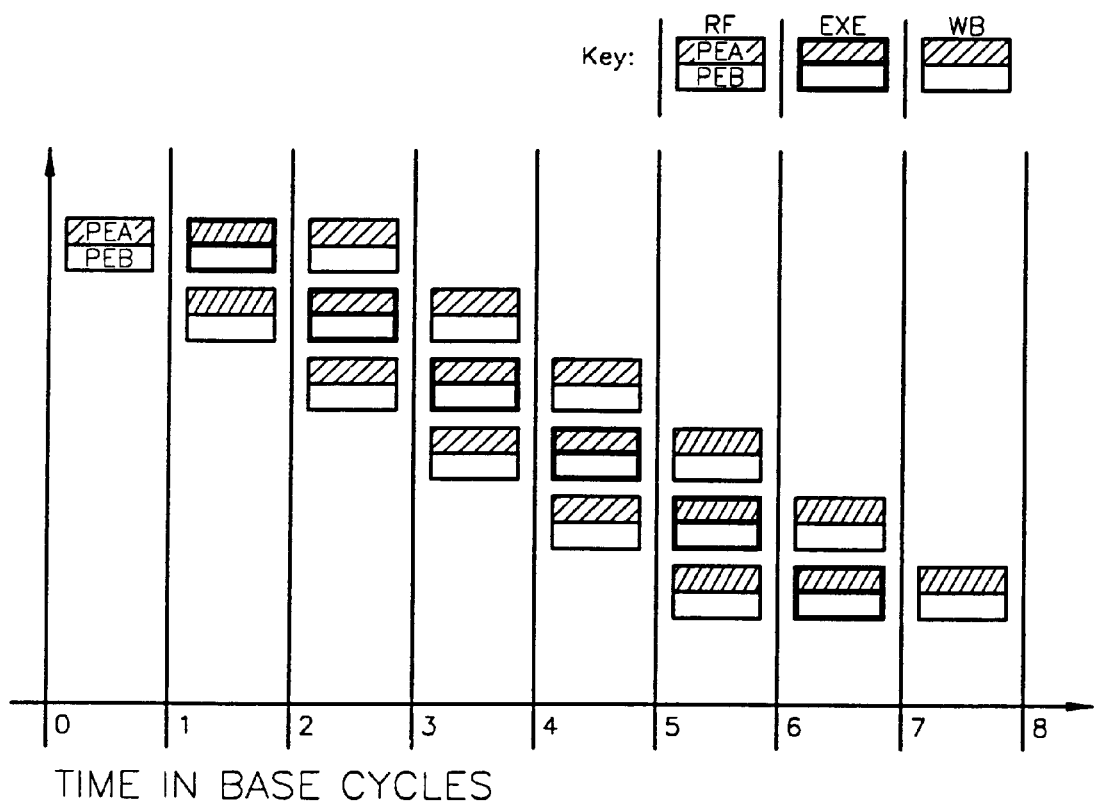
FIG. 3 is a diagram illustrating the operation of the dual mode Galois field data path shown in FIG. 2.

FIG. 3 is a diagram showing the pipelined operations of two operation units PEA and PEB. A latency is a three clock cycle and the throughput is one command/cycle.

Figure 4A:
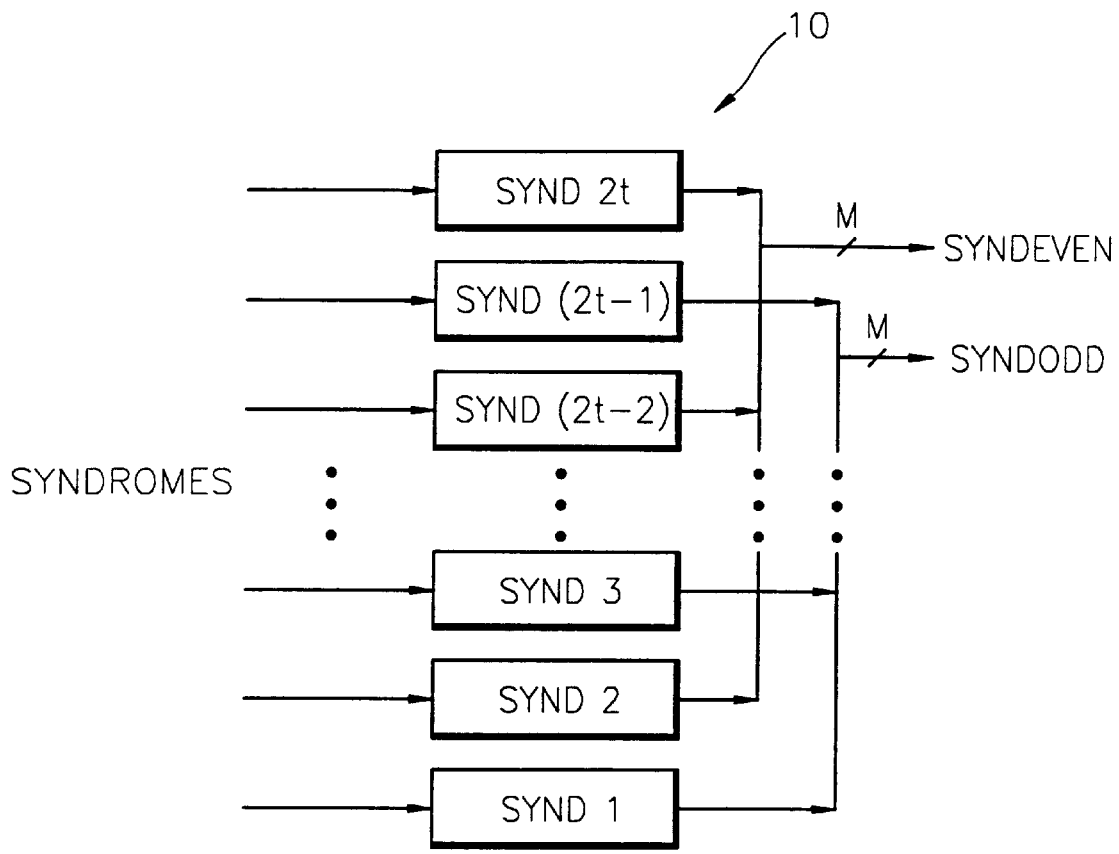
FIG. 4A is a detailed schematic circuit diagram of the syndrome register block shown in FIG. 1.
Figure 4B:
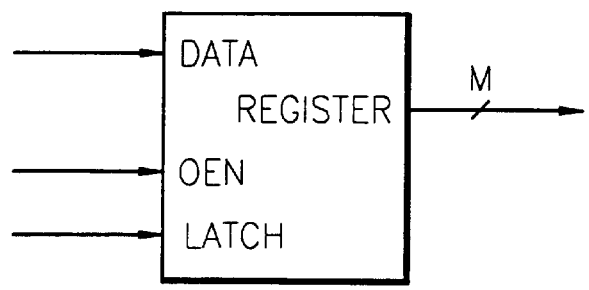
FIG. 4B is a schematic diagram which illustrates the operation of registers shown in FIG. 4A.

FIG. 4A is a detailed block diagram of the syndrome register block 10 which includes t even-degree syndrome registers (SYND 2, SYND 4, . . . , and SYND 2t) and t odd-degree syndrome registers (SYND 1, SYND 3, . . . , and SYND (2t−1)). All registers have a width of M (the degree of a primitive polynomial which generates used finite fields) bits. The total number of registers is 2t, where t is the limitation of correctable errors of a code. As shown in FIG. 4B, the respective registers latch and output the even-degree syndromes and the odd-degree syndromes which are input to a data terminal DATA according to the output enable signal applied to an enable terminal OEN and the latch signal applied.to a latch terminal LATCH. Therefore, among the output of the syndrome register block 10, one odd-degree syndrome value and one even-degree syndrome value are selected, and the two selected syndrome values are input to the register fetch unit RF of the DMGFDP 18.

Figure 5:
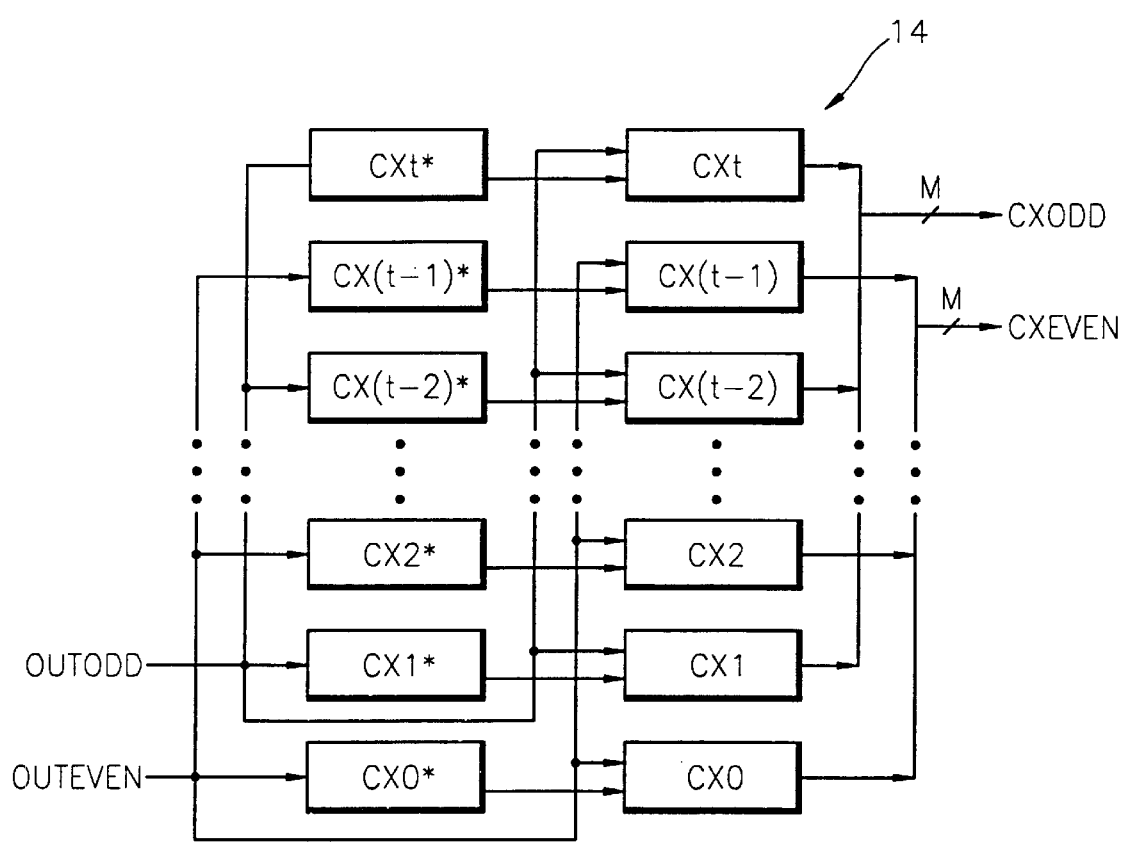
FIG. 5 is a detailed schematic circuit diagram of the connection polynomial register block shown in FIG. 1.

FIG. 5 is a detailed block diagram of the connection polynomial register block 14. The even-degree modified connection polynomial coefficient register block 112 includes (t+1)/2 registers (CX0*, CX2*, . . . , and CXt*). The odd-degree modified connection polynomial coefficient register block 108 includes (t+1)/2 registers (CX1*, CX3*, . . . , and CX(t−1)*). Also, the even-degree modified connection polynomial coefficient register block 114 includes (t+1)/2 registers (CX0, CX2, . . . , and CXt). The odd-degree modified connection polynomial coefficient register block 110 includes (t+1)/2 registers (CX1, CX3, . . . , and CX(t−1)).

A quantity (t+1) M bit registers (CX0*, CX1*, . . . , and CXt*) for correcting the coefficients of the connection polynomial have coefficients corrected using the discrepancy generated by the respective iterative executions. A quantity (t+1) registers (CX0, CX1, . . . , and CXt) come to have coefficients of the connection polynomial. Here, the registers (CX0, CX1, . . . , and CXt) have two input ports in order to update the coefficients of the modified connection polynomial to the coefficients of the connection polynomial without losing a clock cycle. One is an input port for loading the output of the DMGFDP 18 (refer to FIG. 1) and the other is an input port for loading the outputs of the (t+1) registers (CX0*, CX1*, . . . , and CXt*) in the modified connection polynomial register blocks. The outputs (CXODD and CXEVEN) of the (t+1) registers (CX0, CX1, . . . , and CXt) in the connection polynomial register blocks are selectively transmitted to the dual mode Galois field data path 18.

Figure 6A:
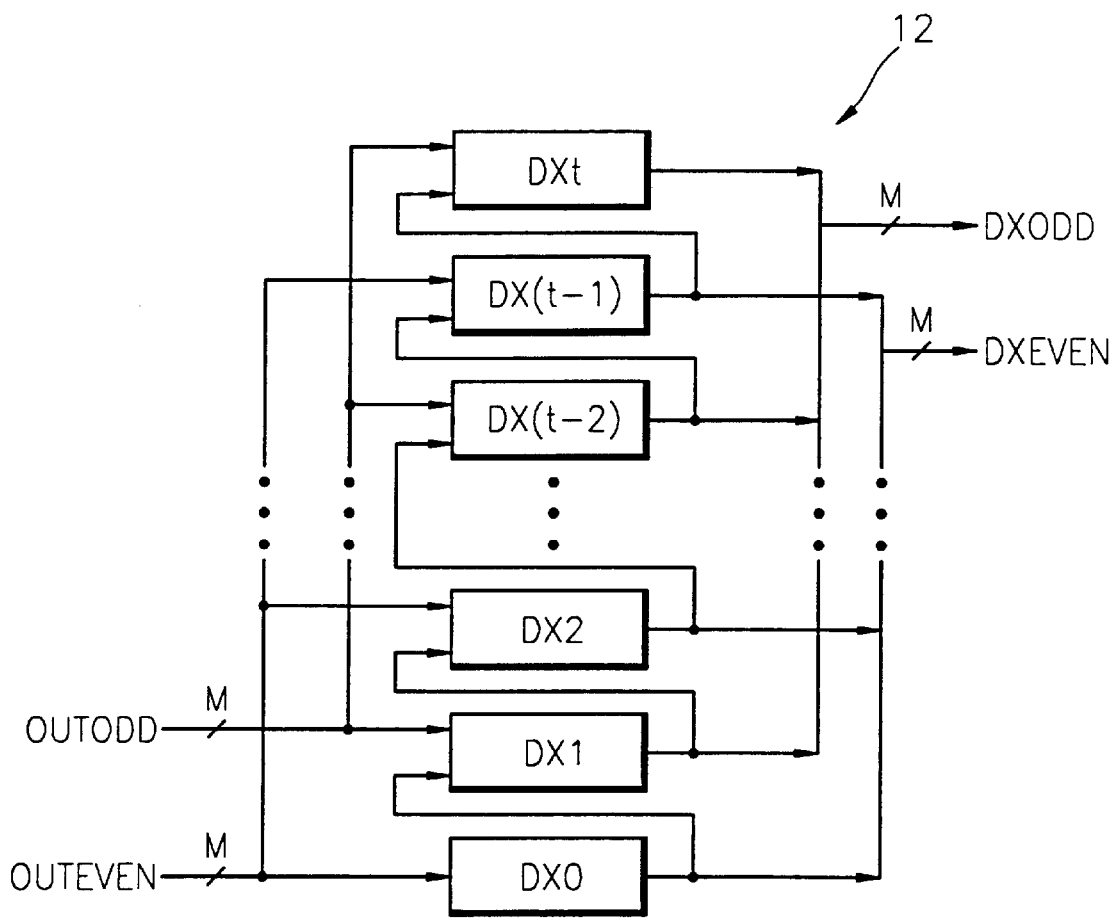
FIG. 6A is a detailed schematic circuit diagram of the correction polynomial register block shown in FIG. 1.
Figure 6B:
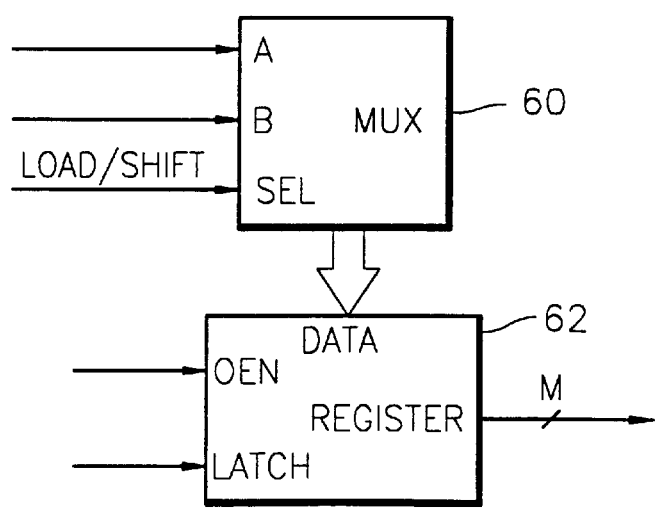
FIG. 6B is a schematic diagram which illustrates operation of registers shown in FIG. 6A.

FIG. 6A is a detailed block diagram showing the correction polynomial register block 12. The even-degree correction polynomial coefficient register block 106 includes (t+1)/2 registers (DX0, DX2, . . . , and DXt). The odd-degree correction polynomial coefficient register block 104 includes (t+1)/2 registers (DX1, DX3, . . . , and DX(t−1)). A quantity (t+1) M bit registers (DX1, DX2, . . . , and DXt) have two input ports. One is an input port for loading the output of the DMGFDP 18 and the other is an input port to which the output of a lower-degree register is input. The bus occupation to the DMGFDP 18 is controlled by the output enable signal with respect to the outputs of (t+1) registers (DX0, DX1, . . . , and DXt) in the correction polynomial register block, as shown in FIG. 6B. FIG. 6B illustrates the operations of the respective registers shown in FIG. 6A. Reference numerals 60 and 62 denote a multiplexer and a register, respectively. Since one of the inputs of the multiplexer 60 is the output of the lower-degree register, when lower-degree coefficients are shifted to the right upper-degree register, an operation such as D(x)=xD(x) can be performed among the operations of Table 1.

Figure 7:
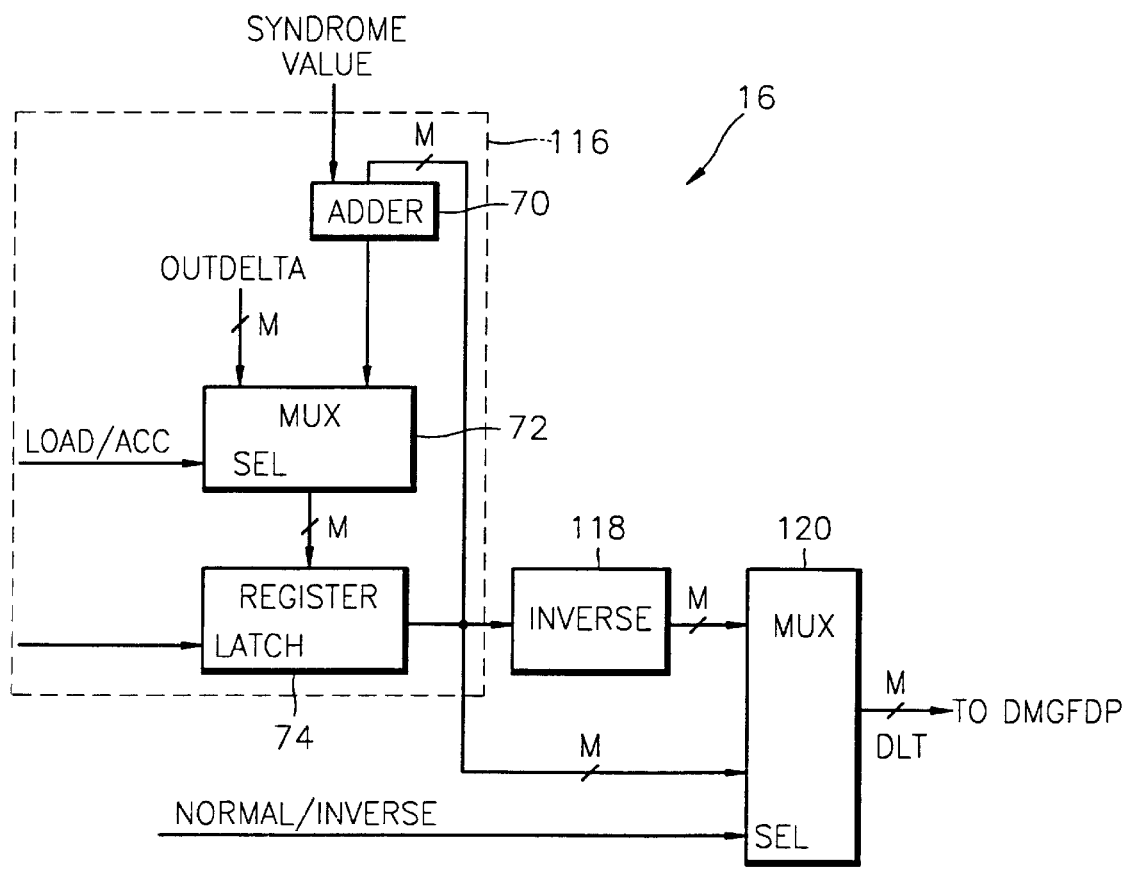
FIG. 7 is a schematic diagram which illustrates a discrepancy register block in detail.

FIG. 7 is a detailed block diagram showing the discrepancy register block 16. The discrepancy register block 16 includes a delta register block 116, an inversion unit 118, and a multiplexer 120. The delta register block 116 includes an accumulator 70 for obtaining a discrepancy value for updating the connection polynomial so as to continuously generate syndromes equal to the previously known syndromes, a multiplexer 72 for selectively outputting the delta output (OUTDELTA) and the output of the accumulator 70, and a register 74 for storing the output of the multiplexer 72 and outputting the output of the multiplexer 72 to the accumulator 70. The inversion unit 118 inverts the output of the accumulator 70. The multiplexer 120 selectively outputs the output of the register 74 and the output of the inversion unit 118.

The discrepancy register block 16 is used for accumulating the data output from the write unit (WB) of the DMGFDP 18 by the accumulator 70 and obtaining the difference between the data and the previously known syndrome value. The inversion unit 118 is used for the case where division for performing correction is required like D(x)=C(x)/δ of FIG. 1.

As mentioned above, the present invention is designed so as to obtain almost doubled throughput by calculating the even-degree coefficients and the odd-degree coefficients of required polynomials by two data paths and using source registers separated from destination registers, thus preventing collision among resources. That is, according to the present invention, it is possible to obtain the almost doubled throughput with respect to the case where the single data path is used by designing the data path to have a dual pipeline architecture having only two multipliers. The present invention is designed to be able to increase switching speed by pipelining, to thus be suitable for a high speed operation. Accordingly, the present invention can be applied to the BCH/RS decoder where high speed and low power are simultaneously required.

The performance of the present invention is compared with the performance of the architecture having the single data path in Table 2 below.

TABLE 2

| Dual data path | Controller | Entire performance |
| --- | --- | --- |
| <2X speed (branch) | >1X area | =½ cycle/command |
| <2X area | >1X energy | 1<area/command<2 |
| >2X energy | =clock frequency | 1>energy/command>1/2 |
| =clock frequency | | =>½<energy X delay<1 |

As shown in Table 2, according to the present invention, the speed is expected to be doubled using the same operation clock since the data path has two operation units. However, the area of the data path is doubled and the consumption of energy in the data path is also doubled. However, since the hardware of a controller (not shown) for controlling the dual data path does not need overhead, the increased amounts of the area due to the built-in controller and energy consumption are small. Therefore, the entire area including the controller and the data path is not doubled and the speed is increased to a half cycle per command. As a result, area/command is smaller than 2 and an energy/command is smaller than 1. Accordingly, it is possible to make an entire energy-delay product smaller than 1, and to thus improve the performance. Namely, according to the present invention having the dual architecture, the speed is almost doubled using the same operation clock with respect to the case where the single data path is used and the energy-delay product is smaller than 1. Accordingly, it is possible to achieve low power operation as well as high speed operation.

Since the Galois processor having the dual parallel data path for the BCH/RS decoder according to the present invention where the latency during the operation processes is minimized, has a small area and operates at high speed, it is possible to remarkably improve the performance of the decoder.

While this invention has been particularly shown and described with references to preferred embodiments thereof, it will be understood by those skilled in the art that various changes in form and details may be made therein without departing from the spirit and scope of the invention as defined by the following claims.

What is claimed is:

1. A Galois field processor having a dual parallel data path for a Bose Chaudhuri Hocquenghem/Reed-Solomon (BCH/RS) decoder, comprising:
   a syndrome register block comprising an even-degree syndrome register block for storing even-degree syndrome values from among the syndrome values transmitted by a syndrome generating block and an odd-degree syndrome register block for storing odd-degree syndrome values from among the syndrome values transmitted by the syndrome generating block;
   a correction polynomial register block comprising an even-degree correction polynomial coefficient register block for receiving an even-degree coefficient output and storing even-degree coefficients of a correction polynomial and an odd-degree correction polynomial coefficient register block for receiving an odd-degree coefficient output and storing odd-degree coefficients of the correction polynomial;
   a connection polynomial register block comprising:
      an even-degree modified connection polynomial coefficient register block for receiving the even-degree coefficient output and storing the even-degree coefficients of a modified connection polynomial,
      an odd-degree modified connection polynomial coefficient register block for receiving the odd-degree coefficient output and storing the odd-degree coefficients of the modified connection polynomial,
      an even-degree connection polynomial coefficient register block for receiving the even-degree coefficient output and the output of the even-degree modified connection polynomial coefficient register block and outputting the even-degree coefficients of the connection polynomial, and
      an odd-degree modified connection polynomial coefficient register block for receiving the odd-degree coefficient output and the output of the odd-degree modified connection polynomial coefficient register block and outputting the odd-degree coefficients of the connection polynomial;
   a discrepancy register block for receiving delta output and storing a discrepancy value for updating the connection polynomial so as to continuously generate syndromes equal to previously known syndromes;
   a dual mode Galois field data path (DMGFDP) comprising:
      a first data path for receiving the respective outputs of the syndrome register block, the correction polynomial register block, the connection polynomial register block, and the discrepancy register block, performing first predetermined operations related to the even-degree coefficients of the correction and the connection polynomials, and outputting the even-degree coefficient result of the first predetermined operations,
      a second data path for performing second predetermined operations related to the odd-degree coefficients of the correction and connection polynomials and outputting the odd-degree coefficient result of the second predetermined operation, and
      a delta output unit for performing third predetermined operations related to the even-degree and the odd-degree coefficients of the connection polynomial and outputting the delta output result of the third predetermined operations; and
   an output unit for synthesizing the output of the even-degree connection polynomial coefficient register block with the output of the odd-degree connection polynomial coefficient register block and outputting the synthesis results as the coefficients of an error location polynomial, according to a control signal.

2. The Galois field processor of claim 1, wherein the first data path comprises:
   a first register fetch unit comprising:
      a first input register for selecting, storing and outputting one of the output of the discrepancy register block, the output of the even-degree connection polynomial coefficient register block, and the data of a first bypass bus,
      a second input register for selecting, storing and outputting one of the output of the discrepancy register block and the output of the even-degree syndrome register block, and
      a third input register for selecting, storing and outputting one of the output of the even-degree correction polynomial coefficient register, the output of the even-degree connection polynomial coefficient register block, and the output of the odd-degree connection polynomial coefficient register block;
   a first execute unit comprising a first multiplier for multiplying the output of the second input register with the output of the third input register and a first adder for adding the output of the first input register to the output of the first multiplier; and
   a first output register for selecting and storing one of the output of the first multiplier and the output of the first adder and outputting the one of the output of the first multiplier and the output of the first adder as the even-degree coefficient output, and providing input data to the first input register through the first bypass bus.

3. The Galois field processor of claim 2, wherein the second data path comprises:
   a second register fetch unit comprising:
      a fourth input register for receiving, storing, and outputting the output of the odd-degree connection polynomial coefficient register block,
      a fifth input register for selecting, storing and outputting one of the output of the odd-degree correction polynomial coefficient register block, the output of the even-degree connection polynomial coefficient register block, and the output of the odd-degree connection polynomial coefficient register block, and
      a sixth input register for selecting, storing and outputting one of the output of the discrepancy register block, the output of the odd-degree syndrome register block, and the data of a second bypass bus;

a second execute unit comprising a second multiplier for multiplying the output of the fifth input register with the output of the sixth input register and a second adder for adding the output of the fourth input register to the output of the second multiplier; and a second output register for selecting and storing one of the output of the second multiplier and the output of the second adder and outputting the selected one of the output of the second multiplier and the output of the second adder as the odd-degree coefficient output, and providing input data to the sixth input register through the second bypass bus.

4. The Galois field processor of claim 3, wherein the delta output unit comprises:

a third adder for adding the output of the first adder to the output of the second adder; and a third output register for storing and outputting the output of the third adder.

5. The Galois field processor of claim 1, wherein the even-degree correction polynomial coefficient register block and the odd-degree correction polynomial coefficient register block each comprise a plurality of registers and the output of a lower-degree register is input to the right upper-degree register.

6. The Galois field processor of claim 1, wherein the discrepancy register block comprises:

an accumulator for obtaining the discrepancy value for updating the connection polynomial so as to continuously generate syndromes equal to previously known syndromes;

a delta register block comprising a first multiplexer for selectively outputting the delta output and the output of the accumulator and a register for storing the output of the first multiplexer and outputting the output of the first multiplexer to the accumulator; an inversion unit for inverting the output of the accumulator; and a second multiplexer for selectively outputting the output of the delta register block and the output of the inversion unit.

7. A Galios field processing apparatus for use in a Bose Chaudhuri Hocquenghem/Reed-Solomon (BCH/RS) decoder, for performing a feedback shift register (FSR) synthesis algorithm of Massey-Berlekamp, comprising:

a first processor for receiving even-degree syndrome values transmitted by a syndrome generating block, odd-degree coefficients of a connection polynomial and a discrepancy value, performing first predetermined operations related to even terms of a delta and even-degree coefficients of both of a correction polynomial and the connection polynomial, and outputting even-degree coefficients of the connection polynomial and a summation of the even terms of the delta;

a second processor for receiving odd-degree syndrome values transmitted by the syndrome generating block, even-degree coefficients of the connection polynomial and the discrepancy value, performing second predetermined operations related to odd terms of the delta and odd-degree coefficients of the polynomials, and outputting odd-degree coefficients of the connection polynomial and a summation of the odd terms of the delta;

a delta output unit for receiving and adding the summation of the even terms of the delta and the summation of the odd terms of the delta and outputting an addition result as a delta output;

a discrepancy register block for receiving the delta output and storing the discrepancy values for updating the connection polynomial so as to continuously generate syndromes equal to previously known syndromes; and an output unit for synthesizing the even-degree coefficients of the connection polynomial and the odd-degree coefficients of the connection polynomial and outputting the synthesis results as the coefficients of an error location polynomial, according to a control signal.

8. A Galios field processing apparatus of claim 7, wherein the first processor comprises:

an even-degree syndrome register block for storing the even-degree syndrome values;

an even-degree correction polynomial coefficient register block for receiving an even-degree coefficient output and storing even-degree coefficients of the correction polynomial;

an even-degree modified connection polynomial coefficient register block for receiving the even-degree coefficient output and storing the even-degree coefficients of a modified connection polynomial;

an even-degree connection polynomial coefficient register block for receiving the even-degree coefficient output and the even-degree coefficients of the modified connection polynomial and storing the even-degree coefficients of the connection polynomial;

a first data path for receiving the respective outputs of the even-degree syndrome register block, the even-degree correction polynomial coefficient register block, the even-degree connection polynomial coefficient register block and the discrepancy register block, producing the even-degree coefficient output and the even terms of the delta.

9. A Galios field processing apparatus of claim 7, wherein the second processor comprises:

an odd-degree syndrome register block for storing the odd-degree syndrome values;

an odd-degree correction polynomial coefficient register block for receiving an odd-degree coefficient output and storing odd-degree coefficients of the correction polynomial;

an odd-degree modified connection polynomial coefficient register block for receiving the odd-degree coefficient output and storing the even-degree coefficients of a modified connection polynomial;

an odd-degree connection polynomial coefficient register block for receiving the odd-degree coefficient output and the odd-degree coefficients of the modified connection polynomial and storing the odd-degree coefficients of the connection polynomial;

a first data path for receiving the respective outputs of the odd-degree syndrome register block, the odd-degree correction polynomial coefficient register block, the odd-degree connection polynomial coefficient register block and the discrepancy register block, producing the odd-degree coefficient output and the odd terms of the delta.

* * * * *